United States Patent
Lee (10) Patent No.: US 9,059,279 B2
(45) Date of Patent: Jun. 16, 2015

(54) SEMICONDUCTOR DEVICE AND METHOD FOR FORMING THE SAME

(71) Applicant: SK HYNIX INC., Icheon (KR)

(72) Inventor: Min Jin Lee, Icheon (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 14/178,197

(22) Filed: Feb. 11, 2014

(65) Prior Publication Data

US 2015/0028411 A1    Jan. 29, 2015

(30) Foreign Application Priority Data

Jul. 26, 2013  (KR) .................. 10-2013-0088530

(51) Int. Cl.
*H01L 23/52* (2006.01)
*H01L 29/78* (2006.01)
*H01L 23/525* (2006.01)

(52) U.S. Cl.
CPC ........ *H01L 29/7827* (2013.01); *H01L 23/5252* (2013.01)

(58) Field of Classification Search
None
See application file for complete search history.

(56) References Cited

U.S. PATENT DOCUMENTS

| | | | |
|---|---|---|---|
| 7,838,928 B2 * | 11/2010 | Graf et al. | 257/330 |
| 2002/0093074 A1 * | 7/2002 | Bertin et al. | 257/530 |
| 2011/0079844 A1 * | 4/2011 | Hsieh | 257/334 |
| 2011/0079884 A1 * | 4/2011 | Basim et al. | 257/632 |
| 2012/0051164 A1 | 3/2012 | Son et al. | |

FOREIGN PATENT DOCUMENTS

| | | |
|---|---|---|
| KR | 10-2011-0029955 A | 3/2011 |
| KR | 10-2012-0020272 A | 3/2012 |

* cited by examiner

*Primary Examiner* — Evan Pert
*Assistant Examiner* — Herve Assouman (57) ABSTRACT

A semiconductor device includes a first gate structure formed in a semiconductor substrate; a second gate structure formed over the semiconductor substrate and over the first gate structure; and a bit line formed in the semiconductor substrate, and formed below the first gate structure.

18 Claims, 7 Drawing Sheets

SEMICONDUCTOR DEVICE AND METHOD FOR FORMING THE SAME

CROSS-REFERENCE TO RELATED APPLICATION

The priority of Korean patent application No. 10-2013-0088530 filed on 26 Jul. 2013, the disclosure of which is hereby incorporated by reference in its entirety, is claimed.

BACKGROUND

Embodiments relate to a semiconductor device and a method for forming the same, and more particularly to an anti-fuse.

In recent times, as information media such as computers have rapidly come into widespread use, technology of a semiconductor device has been rapidly developed. Functionally, it is necessary for a semiconductor device to operate at a high speed and to have a high storage capacity. Therefore, technology for manufacturing semiconductor devices has rapidly developed to improve an integration degree, reliability, a response speed, etc.

The semiconductor device can be inspected to detect a plurality of defective cells in early stages, and the defective cells can be cured through a repair process.

Specifically, anti-fuses have been widely used in the repair process after completion of packaging. The term "anti-fuse" refers to a fuse that is used before the packaging process. The anti-fuse is electrically opened at a normal state. When a high voltage is applied to the anti-fuse at the normal state, an insulator which is contained in the anti-fuse ruptures, and the anti-fuse is short-circuited or coupled to a cell. The anti-fuse may be formed in a periphery region (or a peripheral circuit region), and redundant cells for the anti-fuse may also be formed in the periphery region. The redundant cells may be SRAM cells that do not require refresh operation.

For the anti-fuse to stably operate, a current path should be attributed to the rupture with a high level of reliability.

SUMMARY

Various embodiments are directed to providing a semiconductor device and a method for forming the same that can resolve limitations and disadvantages of the related art.

An embodiment relates to a semiconductor device including an anti-fuse in which a program gate, a select gate, and a bit line are vertically arranged, and a method for forming the same.

In accordance with an aspect of the embodiment, a semiconductor device includes: a first gate structure formed in a semiconductor substrate; a second gate structure formed over the semiconductor substrate and over the first gate structure; and a bit line formed in the semiconductor substrate, and formed below the first gate structure.

In accordance with an aspect of the embodiment, a semiconductor device includes: a select gate formed in a semiconductor substrate; a program gate formed over the semiconductor substrate and over the select gate; a first current path formed at a first side of the select gate when the program gate is ruptured; a second current path formed at a second side of the select gate when the program gate is ruptured; and a bit line formed in the semiconductor substrate and formed below the select gate.

When the first rupture region is ruptured, the first current path is between the second junction region and the first junction region, and when the second rupture region is ruptured, the second current path is between the third junction region and the first junction region.

In accordance with another aspect of the embodiment, a semiconductor device includes: a first gate line buried in a semiconductor substrate; a plurality of second gate lines spaced apart from each other by a predetermined distance, formed over the semiconductor substrate, and arranged along a direction perpendicular to the first gate line; and a bit line formed in the semiconductor substrate, formed below the first gate line, and formed along the same direction as the first gate line.

In accordance with another aspect of the embodiment, a method for forming a semiconductor device includes: forming a bit line in a semiconductor substrate; forming a first gate structure over the bit line in the semiconductor substrate; and forming a second gate structure over the semiconductor substrate and over the first gate structure.

The forming the bit line includes forming a first recess in the semiconductor substrate; and depositing a first conductive material in the first recess.

The forming the bit line further includes forming a second recess in the first recess by etching the first conductive material; and filling the second recess with a silicon material.

The method further may comprise after the formation of the bit line, forming a first junction region in the semiconductor substrate formed over the bit line.

The first junction region is formed in the semiconductor substrate disposed between the bit line and the first gate structure.

The method further may comprise after the formation of the first gate structure, forming a second junction region and a third junction region by implanting impurities into the semiconductor substrate disposed at both sides of the first gate structure.

The forming the first gate structure includes forming a first recess by etching the semiconductor substrate formed over the bit line; forming a first gate insulation film in the first recess; forming a conductive material over the first gate insulation film; and removing at least a portion of the first gate insulation film and the first conductive material in an upper portion of the first recess to form a second recess.

The forming the second gate structure includes forming a second gate insulation film in the second recess and over the semiconductor substrate; and forming a second conductive material over the second gate insulation film.

The second gate insulation film is less thick than the first gate insulation film.

The method further may comprise forming a junction region by implanting impurities into both sidewalls of the second recess.

It is to be understood that both the foregoing general description and the following detailed description of embodiments are exemplary and explanatory.

BRIEF DESCRIPTION OF THE DRAWINGS

FIGS. 1(i)-1(iii) are views illustrating an anti-fuse according to an embodiment.

DESCRIPTION OF EMBODIMENTS

Embodiments and examples will be illustrated below with reference to the accompanying drawings. Wherever possible, the same reference numbers will be used throughout the drawings to refer to the same or like parts. In the following description, a detailed description of related known configurations or functions may be omitted.

The anti-fuse array includes a plurality of program transistors, a plurality of select transistors, and a plurality of bit lines. One program transistor, one select transistor, and one bit line will be selected to program a given (selected) cell.

That is, when a program transistor receives a high voltage, a gate insulation film (or gate oxide film) of the program transistor is ruptured due to a difference of voltage. In addition, a predetermined voltage is applied to a gate of the select transistor to turn on the select transistor. Under this condition, the high voltage applied to the program transistor is transmitted to a channel region of the select transistor and then drains out through the bit line.

In accordance with an embodiment, the program transistor, the select transistor, and the bit line may be vertically arranged to increase a number of net dies per wafer. In addition, the select transistor is arranged below the program transistor in such a configuration of dividing the program transistor. In other words, the select transistor is arranged in the middle of the gate insulation film of the program transistor. Comparing with conventional art where the program transistor and the select transistor are arranged laterally to each other, the program transistor and the select transistor of the embodiment may be arranged vertically to each other. Under the vertical structure, a current path created by rupture of the gate insulation film of the program transistor can be more reliably formed.

For example, under the conventional lateral structure, a single current path is created between the program transistor and the select transistor. In contrast, under the vertical structure, a plurality of current paths may be created between the program transistor and the select transistor. That is, a probability of creating current paths by rupture may increase, e.g., by about twice or more. As a result, device reliability improves. The semiconductor device and a method for forming the same according to the embodiment will hereinafter be described with reference to FIGS. 1 to 3J.

Figure 1:
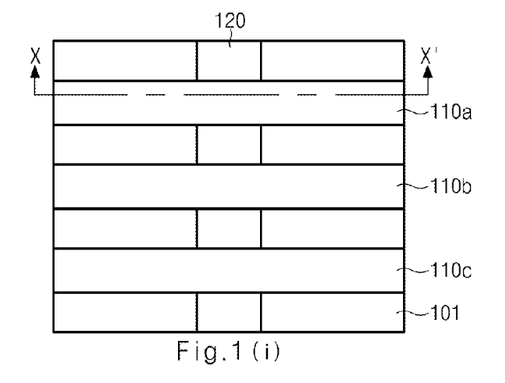
Figure 2:
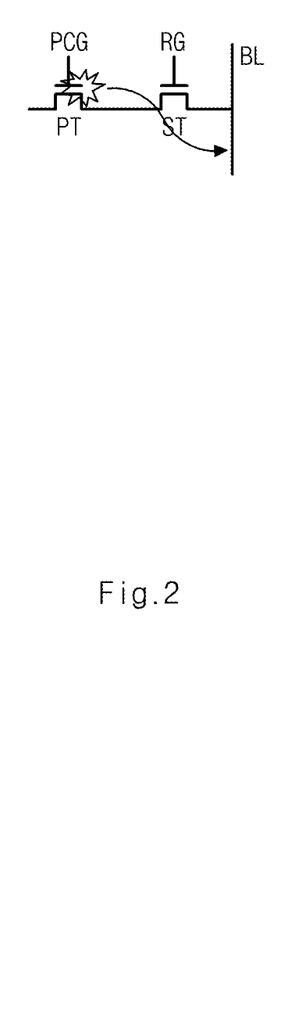
FIG. 2 is a circuit diagram illustrating the anti-fuse according to an embodiment.

FIG. 1(*i*) is a plan view illustrating an anti-fuse array according to an embodiment. FIG. 1(*ii*) is a perspective view illustrating the anti-fuse array. FIG. 1(*iii*) is a cross-sectional view illustrating the anti-fuse array taken along the line X-X shown in FIG. 1(*i*). FIG. 2 is a circuit diagram illustrating the anti-fuse.

Referring to FIG. 2, the anti-fuse includes a program transistor PT and a select transistor ST serially coupled to each other. The program transistor PT includes a program gate PCG and the select transistor ST includes a select gate RG. When a gate oxide film of the program transistor is ruptured and a predetermined voltage is applied to the select gate RG, a current path from the program gate PCG to a bit line BL is formed.

Referring to FIG. 1(*i*), the anti-fuse includes a select gate 120 buried in a semiconductor substrate 101, and a plurality of program gates (110a~110c) which are spaced apart from each other by a predetermined distance and arranged in perpendicular to the select gate 120.

Referring to FIGS. 1(*ii*) and 1(*iii*), the select gate 120 is formed in the semiconductor substrate 101. That is, after a recess is formed in the semiconductor substrate 101 and a first gate insulation film 121 is formed in the recess, a conductive material 123 is formed in an upper portion of the first gate insulation film 121 and fills the recess completely or partly, so that the select gate 120 is formed. In addition, a bit line 130 is buried in the semiconductor substrate 101 and located below the select gate 120.

In addition, a second gate insulation film 111 is formed over the semiconductor substrate 101 including the select gate 120 in a direction perpendicular to the select gate 120, and a conductive material 113 is deposited over the second gate insulation film 111, such that a program gate 110 is formed. A first end of the second gate insulation film 111 formed over a left sidewall of the select gate 120 is referred to as a first rupture region. Likewise, the other end of the second gate insulation film 111 formed over a right sidewall of the select gate 120 is referred to as a second rupture region.

In addition, $N^+$ ion is implanted into the semiconductor substrates 101 located at the left and right sidewalls of the select gate 120, such that junction regions (140, 150) serving as drain/source regions are formed. $N^+$ ion is also implanted into a lower part of the select gate 120. That is, $N^+$ ion is implanted into the semiconductor substrate 101 between the select gate 120 and the bit line 130, resulting in formation of a junction region 160.

As described above, the program gate 110 is formed over the semiconductor substrate 101, and the select gate 120 and the bit line 130 are vertically formed. The select gate 120 and the bit line 130 buried in the semiconductor substrate 101. In this case, the bit line 130 is formed at the lowest position, such that the program gate 110, the select gate 120, and the bit line 130 are sequentially and vertically arranged.

If a high voltage is applied to the program gate 110 in a rupture mode, the first rupture region or the second rupture region, of the second gate insulation film 111, or both may be ruptured. That is, when the first rupture region of the second gate insulation film 111 is ruptured (See 'R1'), a current path A is formed through the junction regions (140, 160), such that a current flows from the select gate 120 to the bit line 130. On the other hand, when the second rupture region of the second gate insulation film 111 is ruptured (See 'R2'), a current path B is formed through the junction regions (150, 160), such that a current flows to the bit line 130 through the select gate 120.

Therefore, the program gate 110 is ruptured at two positions (R1, R2), such that the probability of causing the rupture can increase and the chip integration of the anti-fuse circuit can be improved through vertical arrangement.

A method for forming the anti-fuse according to the embodiment will hereinafter be described with reference to FIGS. 3A to 3J.

Figure 3A:
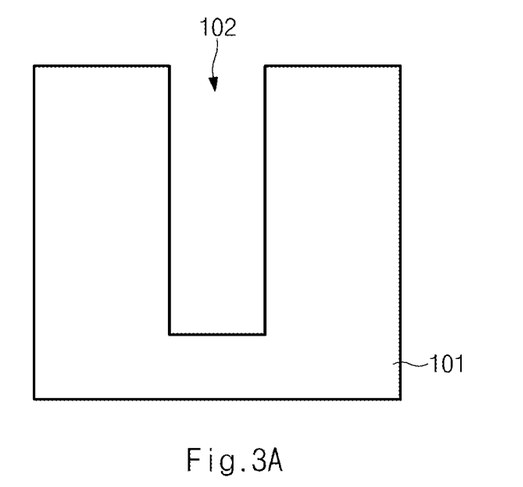
FIGS. 3A to 3J are cross-sectional views illustrating the anti-fuse according to an embodiment.

Referring to FIG. 3A, a semiconductor substrate 101 is etched such that a recess 102 is formed.

Figure 3B:
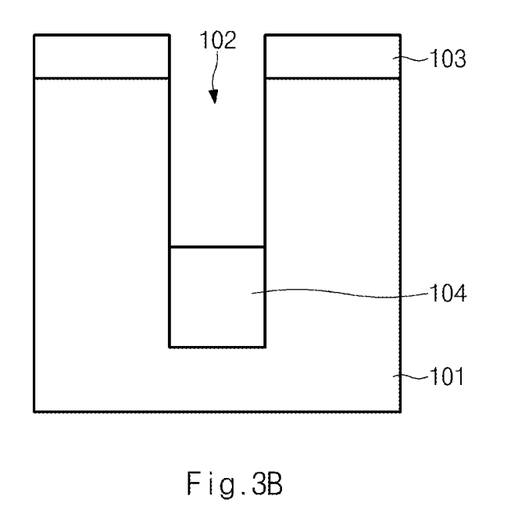

Referring to FIG. 3B, a photoresist mask 103 is formed over the semiconductor substrate 101, and a conductive material 104 for bit-line formation is deposited in the recess 102.

Figure 3C:
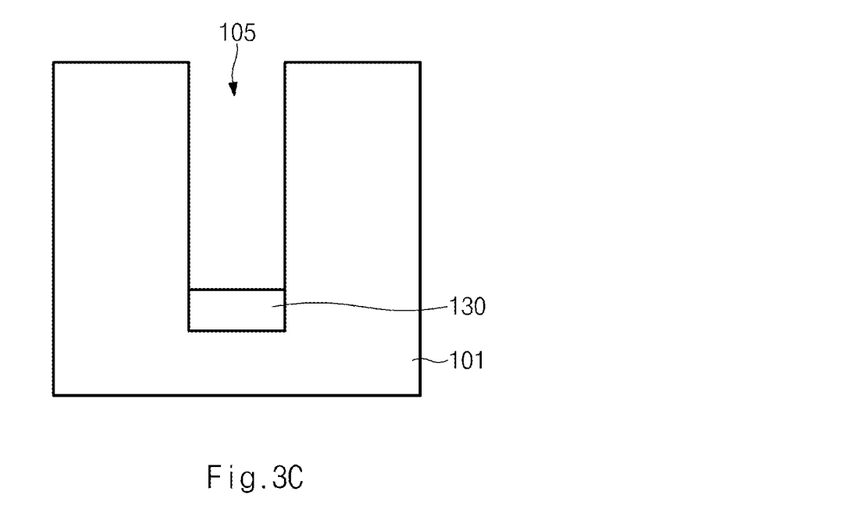

Referring to FIG. 3C, a conductive material 104 is etched in a manner that only the conductive material 104 having a predetermined thickness remains, such that the remaining conductive material is used as a bit line 130. Thereafter, the photoresist mask 103 is removed. In this case, the conductive material 104 may include metal such as tungsten (W), titanium (Ti), titanium nitride (TiN), etc., or may include polysilicon, but not limited thereto. The conductive material 104 may include any kind of material so long as it is capable of being used as a bit-line electrode.

Figure 3D:
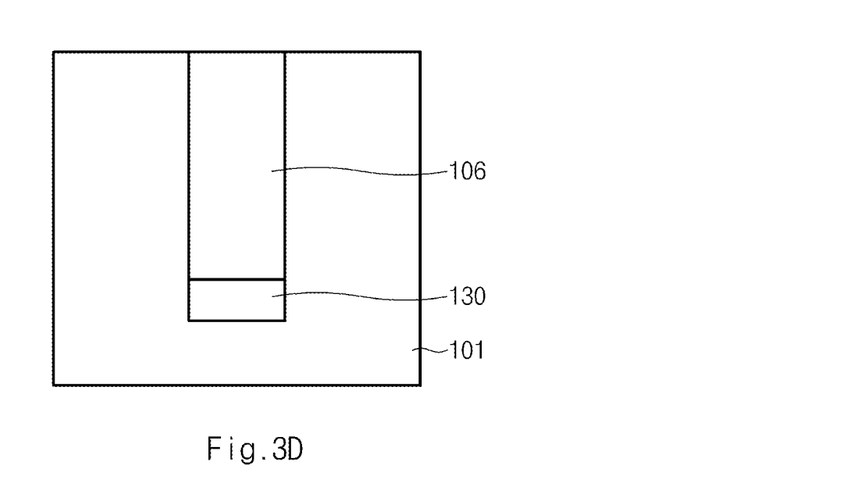

Referring to FIG. 3D, a silicon material 106 fills the recess 105 and is formed at an upper portion of the bit line 130. In this case, the silicon material 106 may be the same material as that forming of the semiconductor substrate 101. The silicon material 106 and the semiconductor substrate 101 may sometimes be collectively referred to as "semiconductor substrate" 101 for convenience of description and better understanding of the embodiments.

Figure 3E:
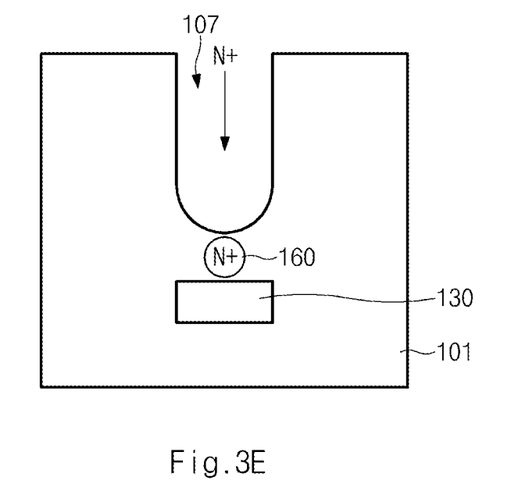

Referring to FIG. 3E, the semiconductor substrate 101 formed over the bit line 130 is etched to form a recess 107, and $N^+$ impurity is implanted into the semiconductor substrate 101 below the recess 107 so as to form a junction region 160. In other words, the junction region 160 is formed between the recess 107 and the bit line 130.

Figure 3F:
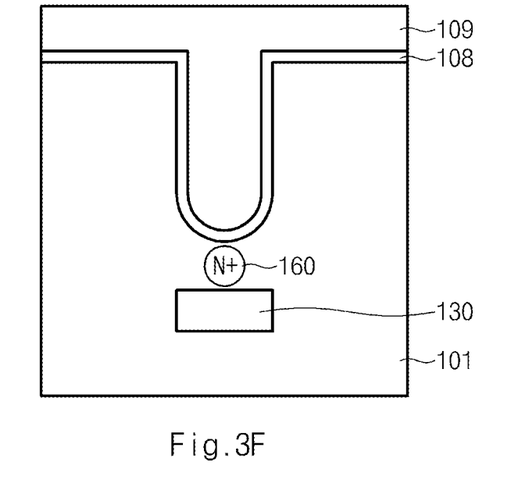

Referring to FIG. 3F, a gate insulation film 108 having a predetermined thickness is deposited over the recess 107 and the semiconductor substrate 101. A conductive material 109 for forming the select gate 120 is deposited over the gate insulation film 108. As a result, the recess 107 filled with the conductive material 109 is formed over the semiconductor substrate 101. The conductive material 109 may include metal such as tungsten (W), titanium (Ti), titanium nitride (TiN), etc. and/or may include polysilicon. The conductive material 109 may also include any kind of material capable of being used as a bit-line electrode. In addition, the gate insulation film 108 may include an oxide film, and the like. After nitrogen ($N_2$) is implanted into the semiconductor substrate 101, the gate insulation film 108 may be formed to about a thickness of 50 Å~57 Å through thermal oxidation.

Figure 3G:
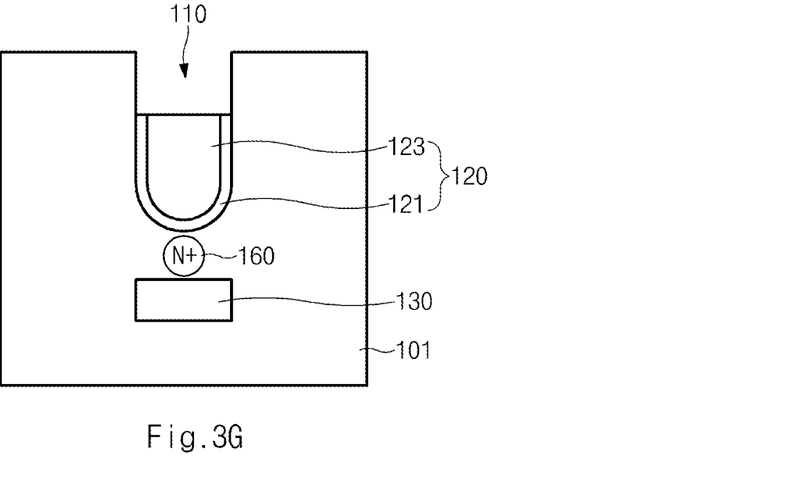

Referring to FIG. 3G, the gate insulation film 108 and the conductive material 109 formed over the semiconductor substrate 101 are removed by a planarization process, for example, a Chemical Mechanical Polishing (CMP) process. Thereafter, the gate insulation film 108 and the conductive material 109 formed in an upper portion of the recess 107 are etched to form a second recess 110. Thus, the remaining gate insulation film (first gate insulation film) 121 and the remaining conductive material 123 located in a lower portion of the recess 107 are used as the select gate 120. In this case, the anti-fuse array of the embodiment may be formed in a peripheral (or periphery) region, and the select gate 120 of the embodiment may be formed along with a buried gate (not shown) of a cell region (not shown). As a result, the first gate insulation film 121 of the select gate 120 may have the same thickness as that of the gate insulation film (not shown) of the cell region (not shown).

Figure 3H:
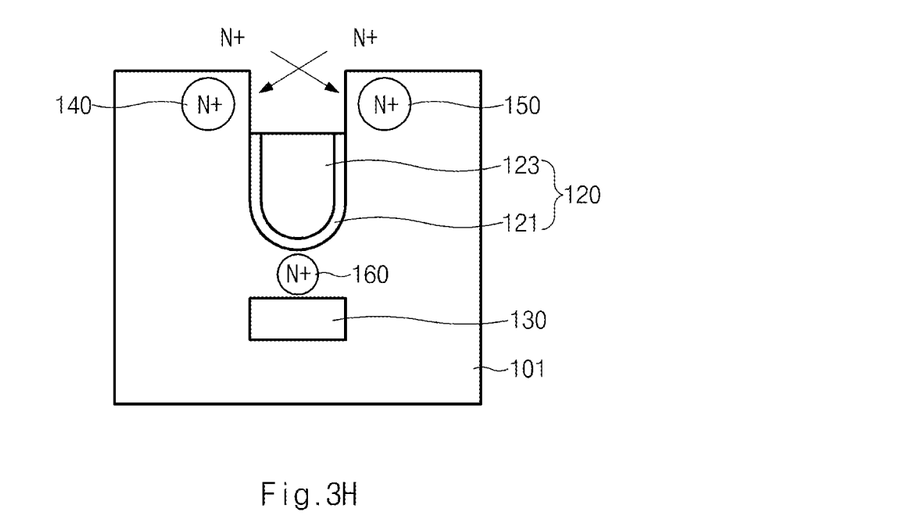

Referring to FIG. 3H, $N^+$ impurity is implanted into both sides of the recess 110 through the recess 110 formed at an upper portion of the select gate 120, such that junction regions (140, 150) are respectively formed at both sides of the recess 110. Here, the junction regions (140, 150) are formed at a predetermined depth at which the junction regions (140, 150) partially may overlap with the select gate 120.

Figure 3I:
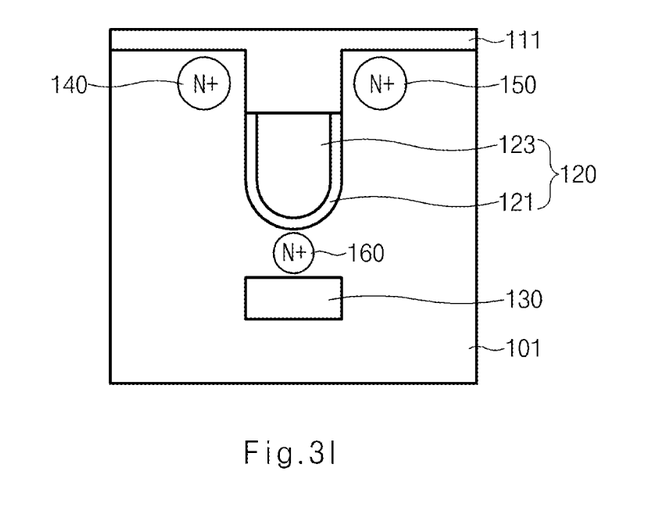

Referring to FIG. 3I, after a second gate insulation film 111 is formed over the recess 110 and the semiconductor substrate 101, the second gate insulation film 111 is planarized or CMP-processed. In this case, the entire recess 110 may be filled with the gate insulation film 111, and the second gate insulation film 111 remaining over the semiconductor substrate 101 may have about a thickness 20 Å~30 Å.

Figure 3J:
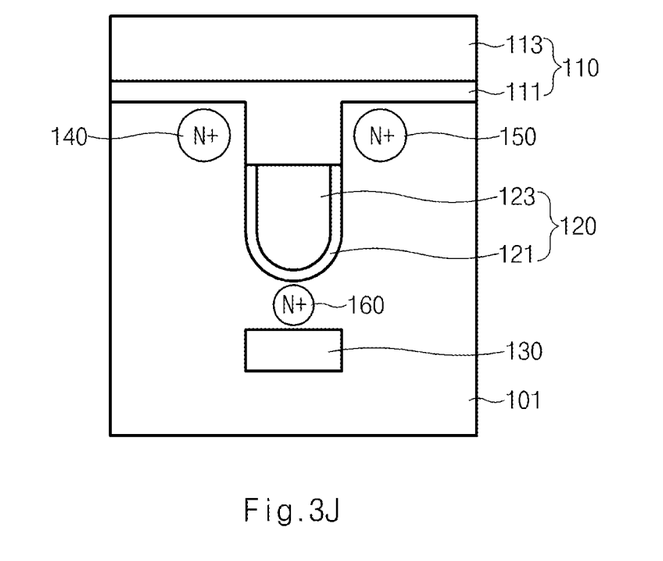

Referring to FIG. 3J, a conductive material 113 for forming the program gate 110 is deposited over the second gate insulation film 111. In this case, the conductive material 113 may include metal such as tungsten (W), titanium (Ti), titanium nitride (TiN), etc. or may include polysilicon. The second gate insulation film 111 and the conductive material 113 may be used as a program gate 110.

As described above, the second gate insulation film 111 of the program gate 110 according to the embodiment may be formed to about a thickness of 20 Å~30 Å. The first gate insulation film 121 of the select gate 120 may be formed to have about a thickness of 50 Å~60 Å. The second gate insulation film 111 of the program gate 110 may have a relatively lesser thickness such that the second gate insulation film 111 can be easily ruptured. The first gate insulation film 121 of the select gate 120 may have a relatively greater thickness to guarantee reliability, resulting in higher reliability of the select transistor.

The program gate 110 is formed over the semiconductor substrate 101, the select gate 120 is in the semiconductor substrate 101 in buried form, and the bit line 130 is formed below the select gate 120 in buried form, resulting in improvement in an integration degree of the semiconductor device.

The select gate 120 is formed at a lower portion of the middle of the program gate 110 which is deposited over the semiconductor substrate 101, and the select gate 120 divides the program gate 110 into several partitions. Under such vertical structure, more current paths can be created, e.g., by twice or more, upon completion of rupture. In addition, rupture range is also increased, increasing device reliability.

As is apparent from the above description, the semiconductor device and the method for forming the same according to the embodiments have the following advantages.

First, the semiconductor device includes an anti-fuse array in which a program gate, a select gate, and a bit line are vertically arranged, resulting in an increased degree of chip integration.

Second, the select gate is formed in the middle of the program gate so the program gate is divided. Thus, upon rupture, a probability of a rupture creating current paths between the program gate and the select gate increases, e.g., by about twice or more. As a result of a reduction in the rupture failure ratio, device reliability improves.

Third, the program gate is formed to have a relatively thin gate insulation film so as to reduce a chance of rupture failure. In contrast, the gate insulation film of the select gate is formed relatively thick, increasing reliability of the select gate.

The above embodiments are illustrative and not limitative. Various alternatives and equivalents are possible. The embodiments are not limited by the type of deposition, etching polishing, and patterning steps described herein. Nor are the embodiments limited to any specific type of semiconductor device. For example, the embodiments may be implemented in a volatile device such as a dynamic random access memory (DRAM) device or non-volatile memory device.

What is claimed is:

1. A semiconductor device comprising:
    a first gate disposed in a semiconductor substrate;
    a second gate disposed over the semiconductor substrate and over the first gate, the second gate including a second gate insulation film; and
    a bit line disposed in the semiconductor substrate, and disposed below the first gate,
    wherein a current path between the second gate and the bit line forms when the second gate insulation film ruptures.

2. The semiconductor device according to claim 1, wherein the first gate structure is disposed perpendicular to the second gate structure.

3. The semiconductor device according to claim 1, further comprising:
    at least one of a first current path formed at a first side of the first gate when the second gate insulation film ruptures in a rupture mode, and a second current path formed at a second side of the first gate when the second gate insulation film ruptures in the rupture mode.

4. The semiconductor device according to claim 3, wherein:
    a first voltage is applied to the first gate in the rupture mode, a second voltage is applied to the second gate in the rupture mode, and a current flows to the bit line through one of the first current path and the second current path.

5. The semiconductor device according to claim 3, wherein the first gate includes:

a first gate insulation film disposed in a recess formed in the semiconductor substrate; and a first conductive material disposed over the first gate insulation film and formed in the recess so as to fill the recess.

6. The semiconductor device according to claim 5, wherein the second gate structure includes a second conductive material disposed over the second gate insulation film.

7. The semiconductor device according to claim 6, wherein:

the second gate insulation film includes a first rupture region and a second rupture region, wherein the first and the second rupture regions are disposed opposite to each other with respect to the first gate structure; and at least one of the first rupture region and the second rupture region is ruptured in the rupture mode.

8. The semiconductor device according to claim 6, wherein the second gate insulation film is thinner than the first gate insulation film.

9. The semiconductor device according to claim 1, wherein the first gate is a select gate, and the second gate is a program gate.

10. The semiconductor device according to claim 7, further comprising:

a first junction region disposed in the semiconductor substrate between the first gate and the bit line;

a second junction region disposed in the semiconductor substrate at a first side of the first gate; and a third junction region disposed in the semiconductor substrate at a second side of the first gate.

11. A semiconductor device comprising:

a select gate disposed in a semiconductor substrate;

a program gate disposed over the semiconductor substrate and over the select gate, the program gate including an insulation film;

at least one of a first current path disposed at a first side of the select gate when the insulation film is ruptured and a second current path disposed at a second side of the select gate when the insulation film is ruptured; and a bit line disposed in the semiconductor substrate and disposed below the select gate.

12. A semiconductor device including an anti-fuse array comprising:

a first gate line buried in a semiconductor substrate;

a plurality of second gate lines spaced apart from each other by a predetermined distance, disposed over the semiconductor substrate, and arranged along a direction perpendicular to the first gate line, each of the plurality of second gate lines including an insulation film; and a bit line disposed in the semiconductor substrate, disposed below the first gate line, and extending along the same direction as the first gate line, wherein a current path between a second gate line and the bit line forms when the insulation film of the second gate line ruptures.

13. The semiconductor device of claim 1, wherein the current path is activated when the first gate has a predetermined voltage.

14. The semiconductor device of claim 1, wherein the insulation film ruptures irreversibly.

15. The semiconductor device of claim 11, wherein the at least one current path is activated when the select gate has a predetermined voltage.

16. The semiconductor device of claim 11, wherein the insulation film ruptures irreversibly.

17. The semiconductor device of claim 12, wherein the current path is activated when the first gate line has a predetermined voltage.

18. The semiconductor device of claim 12, wherein the insulation film ruptures irreversibly.

* * * * *